US011774530B2

(12) United States Patent
Dannels

(10) Patent No.: US 11,774,530 B2
(45) Date of Patent: Oct. 3, 2023

(54) SYSTEM AND METHOD FOR ROBUST SHIMMING FOR MAGNETIC RESONANCE IMAGING

(71) Applicant: CANON MEDICAL SYSTEMS CORPORATION, Otawara (JP)

(72) Inventor: Wayne Richard Dannels, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/587,697

(22) Filed: Jan. 28, 2022

(65) Prior Publication Data
US 2023/0243906 A1   Aug. 3, 2023

(51) Int. Cl.
*G01R 33/3875* (2006.01)
*G01R 33/54* (2006.01)

(52) U.S. Cl.
CPC ....... *G01R 33/3875* (2013.01); *G01R 33/543* (2013.01)

(58) Field of Classification Search
CPC .............. G01R 33/3875; G01R 33/543; G01R 33/56563; G01R 33/56572
See application file for complete search history.

(56) References Cited

U.S. PATENT DOCUMENTS

| | | | | |
|---|---|---|---|---|
| 2012/0249137 A1* | 10/2012 | Witschey | ........... | G01R 33/3875 324/309 |
| 2012/0262167 A1* | 10/2012 | Lai | ..................... | G01R 33/5611 324/309 |
| 2015/0355306 A1* | 12/2015 | Stemmer | .............. | G01R 33/543 324/309 |
| 2016/0252597 A1 | 9/2016 | Liu et al. | | |

FOREIGN PATENT DOCUMENTS

| | | |
|---|---|---|
| CN | 106249184 B | 7/2019 |
| EP | 0430088 A2 | 6/1991 |

OTHER PUBLICATIONS

Young-Joong Yang, Jinho Park, Jong-Hyun Yoon, and Chang-Beom Ahn. "Field inhomogeneity correction using partial differential phases in magnetic resonance imaging." https://iopscience.iop.org/article/10.1088/0031-9155/60/10/4075/pdf, Apr. 30, 2015.

* cited by examiner

*Primary Examiner* — Rishi R Patel
(74) *Attorney, Agent, or Firm* — Oblon, McClelland, Maier & Neustadt, L.L.P.

(57) ABSTRACT

To achieve a uniform magnetic field in an MRI system, fitting can be performed using a partially differentiated residue phase map, differentiated shim functions, radial weights, a regularization factor, a discontinuity mask, and/or a signal intensity mask to determine coefficients for shim functions. The fitting can be performed iteratively, where the regularization factor is stronger and the radial weights focus on areas of higher confidence during earlier iterations. During later iterations, the regularization factor gradually gets weaker and the radial weights gradually focus on areas of lower confidence.

20 Claims, 6 Drawing Sheets

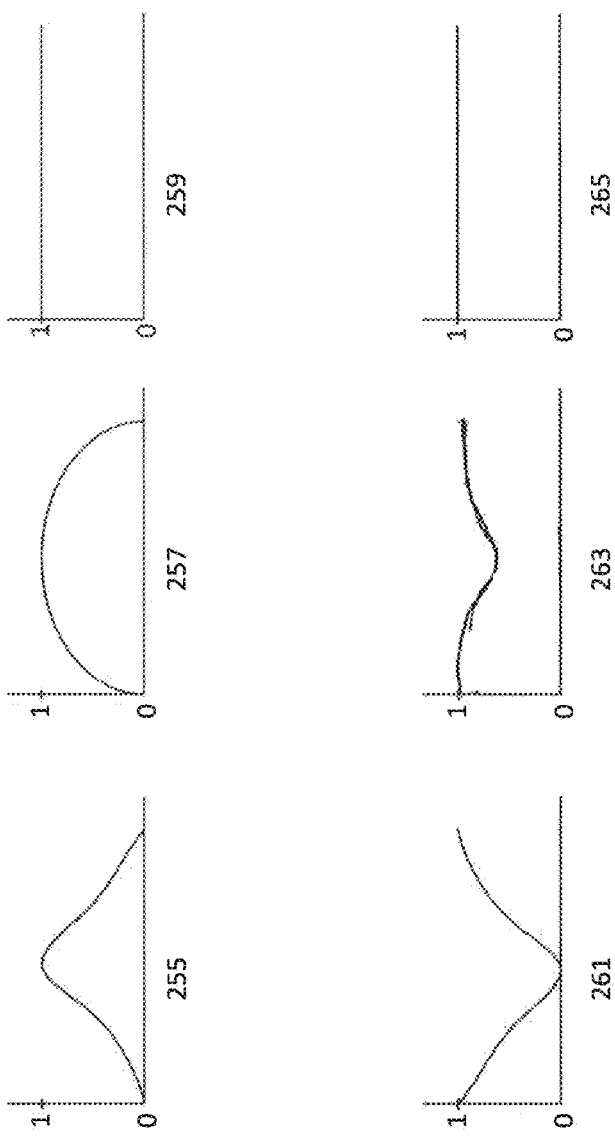

SYSTEM AND METHOD FOR ROBUST SHIMMING FOR MAGNETIC RESONANCE IMAGING

BACKGROUND

Shimming can be performed to counteract or reduce initial raw frequency inhomogeneity in a magnetic resonance imaging (MM) system. This can be done by driving current through various shim coils, which can create fields in specific areas of the MM system to counterbalance field errors and generate a more highly uniform magnetic field.

Determining the amounts of current per shim coil can be error prone and/or suboptimal. In the process of determining the amounts of current, phase unwrapping is often performed. If the phase unwrapping operation fails and is incorrect at one or more points, this error can propagate through one or more regions. In other words, small errors introduced during phase unwrapping can yield very large areas of significant error. Moreover, algorithms for determining optimal shim currents often use specific polynomial sets, which may be unsuitable for non-standard magnet designs (e.g. local and tiled shim coil hardware).

In light of these issues, there would be great benefit to having a technique that can mitigate the drawbacks introduced by phase unwrapping, as well as accommodate non-standard magnet designs.

SUMMARY

The present disclosure is directed to a method of improving magnetic field uniformity comprising: step (1): taking spatial partial derivatives of a residue phase map to generate a partially differentiated residue phase map; step (2): taking spatial derivatives of one or more shim functions, the shim functions approximating magnetic fields producible by respective shim coils, to generate one or more differentiated shim functions; step (3): generating radial weights; step (4): selecting a regularization factor; step (5): generating one or more masks; step (6): determining coefficients for each of the shim functions via fitting, wherein the fitting is based on at least one of the partially differentiated residue phase map, the one or more differentiated shim functions, the radial weights, the regularization factor, and the one or more masks; step (7): updating the residue phase map based on the coefficients and the one or more shim functions to generate an updated phase map; and step (8): iteratively repeating steps (1)-(7) using the updated phase map as the residue phase map for each successive iteration until a predetermined stopping criteria is met, wherein, for each successive iteration, steps (1)-(5) are performed in any order, step (6) is performed after steps (1)-(5), and step (7) is performed after step (6).

The present disclosure is directed to a system for improving magnetic field uniformity comprising: processing circuitry configured to function (1): take spatial partial derivatives of a residue phase map to generate a partially differentiated residue phase map; function (2): take spatial derivatives of one or more shim functions, the shim functions approximating magnetic fields producible by respective shim coils, to generate one or more differentiated shim functions; function (3): generate radial weights; function (4): select a regularization factor; function (5): generate one or more masks; function (6): determine coefficients for each of the shim functions via fitting, wherein the fitting is based on at least one of the partially differentiated residue phase map, the one or more differentiated shim functions, the radial weights, the regularization factor, and the one or more masks; function (7): update the residue phase map based on the coefficients and the one or more shim functions to generate an updated phase map; and function (8): iteratively repeat functions (1)-(7) using the updated phase map as the residue phase map for each successive iteration until a predetermined stopping criteria is met, wherein, for each successive iteration, functions (1)-(5) are performed in any order, function (6) is performed after functions (1)-(5), and function (7) is performed after function (6).

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 2B shows examples of radial weights for different shim coils and iterations, according to an exemplary embodiment of the present disclosure;

DETAILED DESCRIPTION

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

Improved shimming is described herein. Compared to previous, traditional techniques, the system(s) and method(s) discussed herein provide several advantages, including but not limited to: (1) small errors (e.g. from within phase unwrapping) do not propagate/yield large errors; (2) faster, more exact convergence of estimated shim coefficients to their optimal values and/or convergence of the residual phase maps to some minimum; (3) system/method can accommodate local shim arrays; (4) estimated shim coefficients will not be heavily dependent upon regions for which the initial magnetic field uniformity cannot be fitted with the available shims; and (5) not limited to the use of general polynomials for shim coils. The systems and methods discussed herein go through an iterative process to ultimately determine the amount of current that should be applied to various shim coils. The initial iterations correct regions of high certainty, and gradually correct regions of lower certainty in subsequent iterations. This mitigates errors introduced in phase unwrapping by preventing small errors from affecting large areas. Estimated shim coefficients will not be heavily dependent upon regions for which the initial magnetic field uniformity cannot be fitted with the available shims. Further, the techniques discussed herein can accommodate any magnet design. In one embodiment, the techniques discussed herein can be applied to an MM system.

Figure 1:
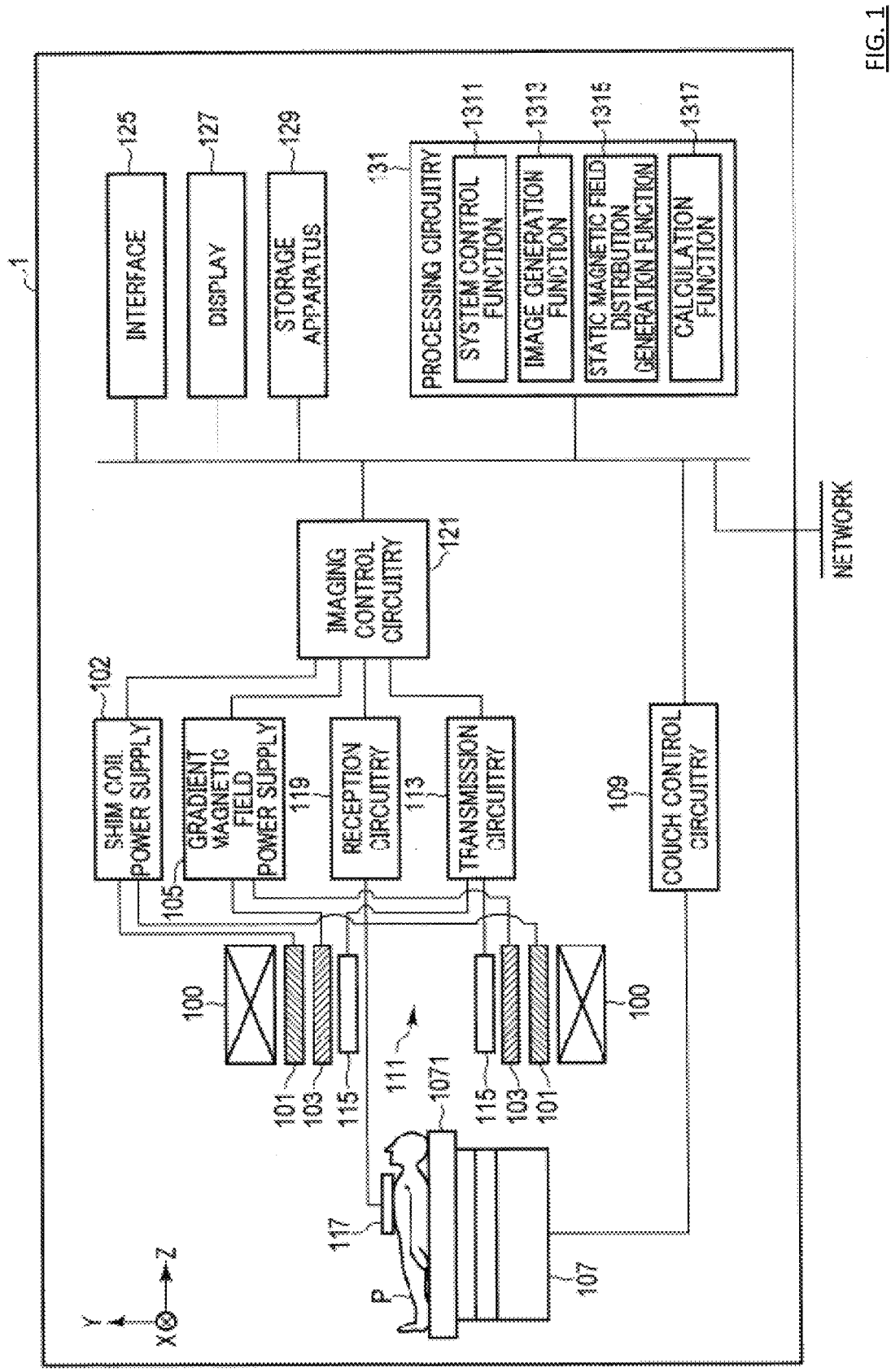
FIG. 1 shows a system diagram for an MRI apparatus, according to an exemplary embodiment of the present disclosure.

Referring now to the drawings, the general configuration of an MRI apparatus 1 according to an embodiment will be described with reference to FIG. 1. As shown in FIG. 1, the MRI apparatus 1 includes a static field magnet 100, a shim coil 101, a shim coil power supply 102, a gradient coil 103, a gradient magnetic field power supply 105, a couch 107, couch control circuitry 109, transmission circuitry 113, a transmission coil 115, a reception coil 117, reception circuitry 119, imaging control circuitry 121, an interface 125, a display 127, a storage apparatus 129, and processing circuitry 131. The couch control circuitry 109, the imaging control circuitry 121, the interface 125, the display 127, the storage apparatus 129, and the processing circuitry 131 are connected either wirelessly or with wires for data transmission. A subject P is not included in the MRI apparatus 1.

The static field magnet 100 is a magnet formed in a hollow, approximately cylindrical, shape. The static field magnet 100 generates an approximately homogeneous static magnetic field in the inner space. For example, a superconducting magnet or the like is used as the static field magnet 100. As shown in FIG. 1, the Z-axis direction is defined as the same as the orientation of the static magnetic field. In addition, the Y-axis direction is a vertical direction, and the X-axis direction is a direction perpendicular to each of the Z-axis and the Y-axis.

The shim coil 101 generates a correction magnetic field that corrects second-order or higher order components of inhomogeneity of a static magnetic field generated by the static field magnet 100. The shim coil 101 is joined to an outer surface of the gradient coil 103, with an insulation layer (not shown) being interposed therebetween. Generally, inhomogeneity of a static magnetic field is expressed by components, such as a 0-order component, first-order components $X^1$, $Y^1$, $Z^1$, and second-order components $X^2$, $Y^2$, $Z^2$, XY, YZ, ZX. There may be third-order or higher order components in inhomogeneity of a static magnetic field. A multiple-order component is a second or higher-order component.

To simplify the description hereinafter, let us suppose a high-order component is a second-order component. In this case, the shim coil 101 has a second-order shim structure. In addition, the shim coil 101 has, for example, five coil patterns each corresponding to second-order components of inhomogeneity of a static magnetic field, ZX, XY, YZ, $(Z^2-(X^2+Y^2)/2)$, and $(X^2-Y^2)$. The five coil patterns of the shim coil 101 respectively generate a five-channel correction magnetic field for correcting the second-order components of inhomogeneity of the static magnetic field, ZX, XY, YZ, $(Z^2-(X^2+Y^2)/2)$, and $(X^2-Y^2)$, in accordance with a current supplied from the shim coil power supply 102. When static magnetic field shimming is performed in consideration of multiple-order components of inhomogeneity of a static magnetic field, the shim coil 101 has coil patterns in accordance with the multiple-order components.

The shim coil power supply 102 is a power supply apparatus that supplies current to the shim coil 101 under the control of the imaging control circuitry 121. Specifically, the shim coil power supply 102 independently supplies a current to each of the five coil patterns in the shim coil 101. In other words, the shim coil power supply 102 supplies each of the five coil patterns in the shim coil 101 with a current corresponding to a second-order shimming value determined by the static magnetic field shimming in the present embodiment.

The gradient coil 103 is a coil formed in a hollow, approximately cylindrical, shape. The gradient coil 103 is arranged inside the shim coil 101. The gradient coil 103 is formed by combining three coils respectively generating gradient fields along the X-, Y-, and Z-axes which are orthogonal to each other. These three coils in the gradient coil 103 are separately supplied with a current from the gradient magnetic field power supply 105, and respectively generate a gradient magnetic field in which intensity of the magnetic field changes along each of the X-, Y-, and Z-axes.

The gradient magnetic field power supply 105 is a power supply apparatus that supplies a current to the gradient coil 103 under the control of the imaging control circuitry 121. Specifically, the gradient coil corresponding to the X-axis generates, through the supply of a current from the gradient magnetic field power supply 105, a correction magnetic field having approximately the same magnetic field direction as the X' component of inhomogeneity of the static magnetic field, and a gradient magnetic field for frequency encoding. The gradient coil corresponding to the Y-axis generates, through the supply of a current from the gradient magnetic field power supply 105, a correction magnetic field having approximately the same magnetic field direction as the Y' component of inhomogeneity of the static magnetic field, and a gradient magnetic field for phase encoding. The gradient coil corresponding to the Z-axis generates, through the supply of a current from the gradient magnetic field power supply 105, a correction magnetic field having approximately the same magnetic field direction as the Z' component of inhomogeneity of a static magnetic field, and a gradient magnetic field for slice selection. In other words, three gradient magnetic field coils respectively corresponding to the X-, Y-, and Z-axes are used to correct first-order components of inhomogeneity of the static magnetic field, in addition to the generation of the gradient magnetic fields relating to imaging.

The fore-mentioned assignment of the gradients X, Y, and Z to the MR imaging features of frequency encoding, phase encoding, and slice selection is of course simply exemplary, and the MR system may of course associate the MR imaging features to the gradients in other orders, or in various combinations. Yet other MR imaging features may be generated by the gradients, as is well known.

The couch 107 is an apparatus having a couch top 1071 on which a subject P is laid. The couch 107 inserts the couch top 1071 on which the subject P is laid into the bore 111, under the control of the couch control circuitry 109. The couch 107 is installed in, for example, an examination room in such a manner that the longitudinal axis of the couch 107 is parallel to the central axis of the static field magnet 100.

The couch control circuitry 109 is the circuitry that controls the couch 107. The couch control circuitry 109 drives the couch 107 in accordance with an operator's instruction, input via the interface 125, to move the couch top 1071 in a longitudinal direction and a vertical direction. The couch control circuitry 109 is an example of a means of realizing a couch control unit.

The transmission circuitry 113 supplies a high-frequency pulse modulated by a Larmor frequency to the transmission coil 115 under the control of the imaging control circuitry 121. The transmission circuitry 113 is an example of a means of realizing a transmission unit.

The transmission coil 115 is an RF coil provided inside the gradient coil 103. The transmission coil 115 generates an RF pulse corresponding to a radio frequency magnetic field in accordance with an output from the transmission circuitry 113. The transmission coil 115 is, for example, a whole-body coil (WB coil) including a plurality of coil elements. The WB coil may be used as a transmission/reception coil. The transmission coil 115 may also be a WB coil made of a single coil.

The reception coil 117 is an RF coil provided inside the gradient coil 103. The reception coil 117 receives MR signals emitted from the subject P, caused by the high frequency magnetic field. The reception coil 117 outputs the received MR signals to the reception circuitry 119. The reception coil 117 is a coil array including, for example, one or more, typically, a plurality of coil elements. In FIG. 1, the transmission coil 115 and the reception coil 117 are illustrated as separate RF coils; however, the transmission coil 115 and the reception coil 117 may be implemented as an integrated transmission/reception coil. The transmission/reception coil is, for example, a local transmission/reception RF coil, such as a head coil, to serve an imaging target in the subject P.

The reception circuitry 119 generates digital MR signals (hereinafter referred to as "MR data") based on the MR signals output from the reception coil 117, under the control of the imaging control circuitry 121. Specifically, the reception circuitry 119 performs various types of signal processing to the MR signals that are output from the reception coil 117, and then performs analog-to-digital (A/D) conversion of data to which the variety of signal processing is performed. The reception circuitry 119 samples the A/D-converted data and thereby generates MR data. The reception circuitry 119 then outputs said generated MR data to the imaging control circuitry 121. The reception circuitry 119 is an example of a means of realizing a reception unit.

The imaging control circuitry 121 controls, for example, the shim coil power supply 102, the gradient magnetic field power supply 105, the transmission circuitry 113, and the reception circuitry 119 in accordance with an imaging protocol that is output from the processing circuitry 131, and performs imaging on the subject P. An imaging protocol has different pulse sequences in accordance with a body part targeted for imaging and a type of examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and time width of the high frequency pulse supplied from the transmission circuitry 113 to the transmission coil 115, timing of the supply of the high frequency pulse from the transmission circuitry 113 to the transmission coil 115, and timing of reception of the MR signals at the reception coil 117, etc. The imaging control circuitry 121 is an example of a means of realizing an imaging unit.

In order to receive various instructions and information inputs from an operator, the interface 125 is realized by a switch button, a mouse, a keyboard, a touch pad with which an input operation can be performed by touching its operation screen; a touch screen in which a display screen and a touch pad are integrated; and non-contact input circuitry using an optical sensor, or sound input circuitry, etc. The interface 125, which is connected to the processing circuitry 131, etc., converts an input operation received from the operator into an electric signal, and outputs the signal to the processing circuitry 131. In the present specification, the interface is not limited to physical operation components such as a mouse and a keyboard. For example, the interface 125 also includes electrical signal processing circuitry that receives an electrical signal corresponding to an input operation through an external input device provided independently from the apparatus, and outputs the electrical signal to the system control circuitry. The interface 125 is an example of a means that realizes an input unit.

The display 127 displays, for example, various MR images generated by an image generation function 1313, and various types of information relating to imaging and image processing, under the control of a system control function 1311 in the processing circuitry 131. The display 127 is, for example, a CRT display, a liquid crystal display, an organic EL display, an LED display, a plasma display, or any other display or a monitor known in this technical field. The display 127 is an example of a means that realizes a display unit.

The storage device 129 stores, for example, MR k-space data for use of the image generation function 1313, image data generated by the image generation function 1313, imaging protocols, imaging conditions including the imaging parameters defining the imaging protocols, and the like. The storage apparatus 129 stores programs corresponding to various functions executed by the processing circuitry 131. The storage apparatus 129 stores a program for calculating a 0-order shimming value, first-order shimming values, and second-order shimming values based on static magnetic field shimming in the present embodiment (hereinafter, "a calculation program").

The 0-order shimming value corresponds to a resonance frequency of water in each of the slices of a collection region in multi-slice collection. In other words, the 0-order shimming value relates to correction with respect to a 0-order component of inhomogeneity of a static magnetic field in each of the slices in the collection region. The first-order shimming values correspond to values of currents respectively supplied to the three gradient coils from the gradient magnetic field power supply 105, so as to correct the $X^1$, $Y^1$, and $Z^1$ components of inhomogeneity of the static magnetic field in each of the slices in the multi-slice collection. In other words, the first-order shimming values relate to correction of the first-order components of inhomogeneity of the static magnetic field in each of the slices of the collection region. The second-order shimming values correspond to values of currents respectively supplied to the five coil patterns in the shim coil 101 from the shim coil power supply 102 so as to correct the ZX, XY, YZ, ($Z^2-(X^2+Y^2)/2$), ($X^2-Y^2$) components of inhomogeneity of the static magnetic field in the entire collection region of the multi-slice collection. In other words, the second-order shimming values relate to correction of the second-order components of inhomogeneity of the static magnetic field in the collection region.

Shimming values may relate to a volume region, such as the total collection of slices of a multi-slice region. Shimming values may relate to a single slice. Shimming values may relate to each of several slices or regions in succession, such as a series of shimming value sets, each set applicable to perhaps a single slice, and each set being independent of the values applicable to the other slices.

The storage apparatus 129 is, for example, a semiconductor memory element, such as a RAM (Random Access Memory) and a flash memory, a hard disk drive, a solid-state drive, or an optical disk, etc. The storage device 129 may be a drive, etc. configured to read and write various kinds of information on a portable storage medium such as a CD-ROM drive, a DVD drive, or a flash memory, etc. The storage 129 is an example of a means of realizing a storage unit.

The processing circuitry 131 includes, as hardware resources, a processor and a memory such as a read-only memory (ROM) and a RAM (not shown) and controls the present MRI apparatus 1. For example, the processing circuitry 131 includes a system control function 1311, an image generation function 1313, a static magnetic field distribution generation function 1315, and a calculation function 1317. The various types of functions executed by the system control function 1311, the image generation function 1313, the static magnetic field distribution generation function 1315, and the calculation function 1317, are stored in the storage apparatus 129 in a form of a computer-executable program. The processing circuitry 131 is a processor which reads a program corresponding to each of those functions from the storage apparatus 129 and executes the program to realize the function corresponding to the program. In other words, the processing circuitry 131, in a state where each of the programs is read, has a plurality of the functions etc. shown in the processing circuitry 131 of FIG. 1.

FIG. 1 illustrates the case where the various functions are realized in a single processor; however, the processing circuitry 131 may be constituted by a combination of independent processors, and the functions may be realized through the processors executing the programs. In other words, each of the above-mentioned functions may be configured as a program, and executed by a single processing circuit; alternatively, a specific function may be implemented in a dedicated independent program-execution circuit. Although FIG. 1 illustrates the single storage apparatus 129, which stores a program corresponding to each processing function, a plurality of storage apparatus may be provided and the processing circuitry 131 may be configured to read a corresponding program from each storage apparatus.

The term "processor" used in the above description means, for example, a CPU (central processing unit), a GPU (graphics processing unit), or circuitry such as an ASIC (application specific integrated circuit), or a programmable logic device (e.g., an SPLD (simple programmable logic device), a CPLD (complex programmable logic device), or a FPGA (field programmable gate array)).

The processor realizes various functions by reading and executing programs which may be stored in the storage apparatus 129. A program may be directly integrated into the circuitry of the processor, instead of storing the program on the storage apparatus 129. In this case, the function is realized through reading and executing the program integrated into the circuitry. Similarly, the bed control circuitry 109, the transmission circuitry 113, the reception circuitry 119, and the imaging control circuitry 121, etc. are constituted by an electronic circuit such as the above-described processor.

The processing circuitry 131 controls the MRI apparatus 1 via the system control function 1311. Specifically, the processing circuitry 131 reads the system control program stored in the storage apparatus 129, loads it in the memory, and controls each circuitry and each power supply of the present MRI apparatus 1 in accordance with the loaded system control program. For example, the processing circuitry 131 reads an imaging protocol from the storage apparatus 129, based on an imaging condition that has been input by an operator through the interface 125. The processing circuitry 131 may also generate an imaging protocol based on conditions for imaging. The processing circuitry 131 transmits the imaging protocol to the imaging control circuitry 121, and controls imaging on the subject P. The processing circuitry 131 that executes the system control function 1311 is an example of a means that realizes a system control unit.

The processing circuitry 131 fills MR data along a readout direction of k-space in accordance with, for example, an intensity of the readout gradient magnetic field via the image generation function 1313. The processing circuitry 131 generates an MR image by executing a Fourier transform to the MR data filled in k-space. The processing circuitry 131 outputs the generated MR image to the display 127 and the storage apparatus 129. The processing circuitry 131 that performs the image generation function 1313 is an example of a means that realizes an image generation unit.

Other variations of the MR system 1 are also possible. For example, the main magnet may be of a pole-face geometry as opposed to a cylindrical or solenoid-like geometry. The gradients coils, shim coils, and RF coils may appear radially in succession in other orders than that specifically depicted in FIG. 1.

An alternate embodiment of an MR system includes one or more shim coils which are localized in close proximity to the patient P. Such local coils are of interest in that they may be effective in shimming local regions. Such local coils however vary from the larger traditional shim coils located near the gradients, in that the larger traditional shim coils produce fields which are well approximated by low-order polynomials expanded about the center of the magnet bore, while the local shim coils cannot be well approximated by such low-order polynomials.

Figure 2A:
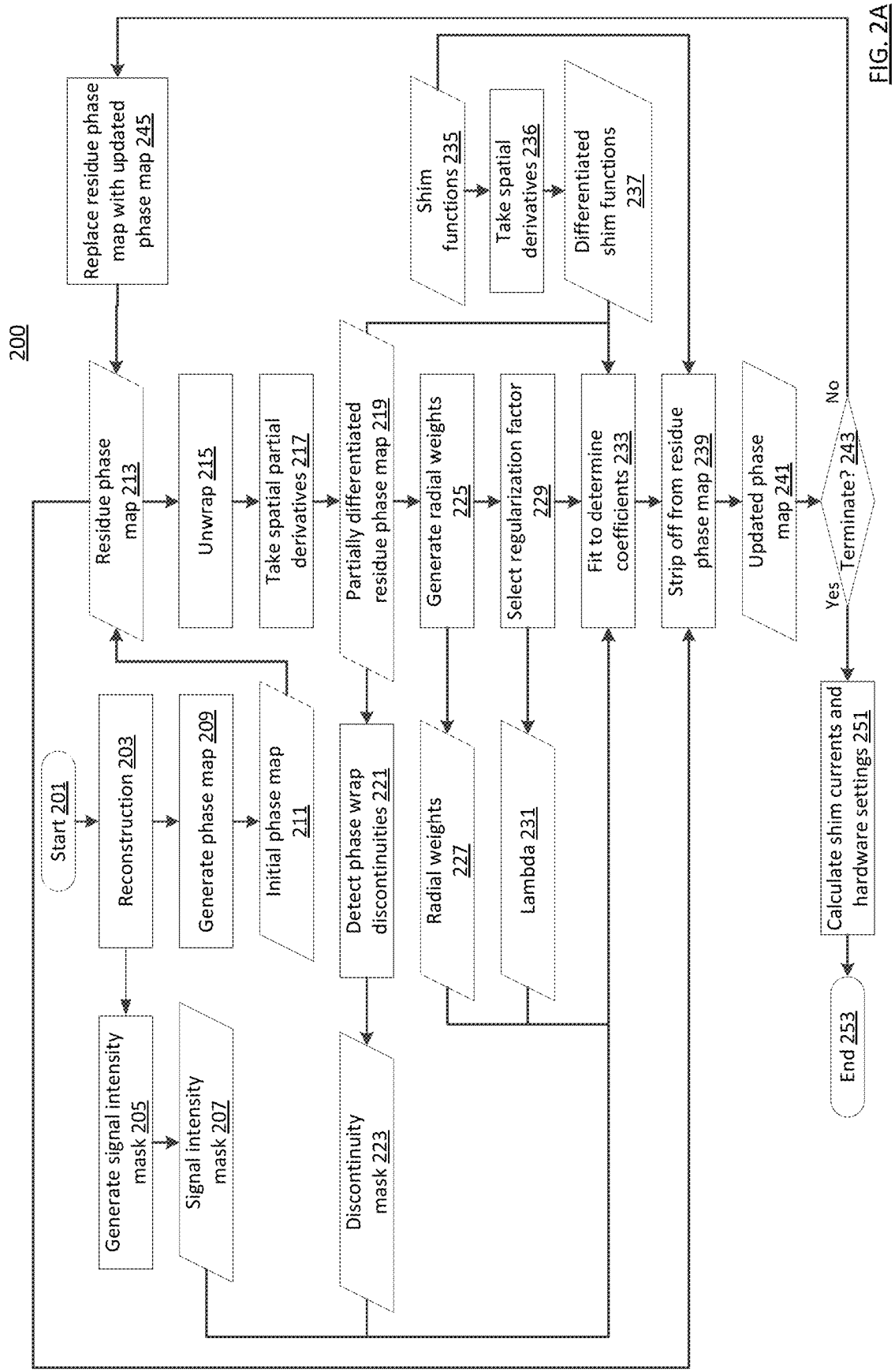
FIG. 2A shows a method for performing shimming, according to an exemplary embodiment of the present disclosure.

FIG. 2A illustrates a method 200 for calculating shim currents and hardware settings to create a uniform magnetic field in an MM system, according to an embodiment of the present disclosure. The process starts at step 201.

In step 203, reconstruction is performed, such as 3DFT. Step 203 can function like collecting and reconstructing two complex images at two echoes using the MM apparatus 1. After step 203, a signal intensity mask 207 can be generated in step 205. The signal intensity mask 207 can be one at portions of the image above a predetermined threshold signal intensity, and zero at portions of the image below the predetermined threshold signal intensity. Masking can be helpful because values with low signal intensity tend to be noisy. An example of a predetermined threshold signal intensity is 10% of the maximum signal intensity magnitude within the area of the image under consideration, though other thresholds can be applied in other embodiments.

Next, an initial phase map 211 can be generated in step 209. The initial phase map 211 can be generated by computing the phase difference between the two complex images collected in step 203, and dividing (pixel-by-pixel) by the echo time difference.

This phase map 211 may be described, if desired, either as a phase map, or as a frequency map, or as a field map. Referring to it as a phase map is appropriate, in that it is the phase of a complex-valued mathematical entity. However, phase map 211 represents the basic frequency of the signal within the patient (independent of applied gradients.) This frequency value, in turn, may be interpreted as map of local magnetic field, including inhomogeneities arising from various physical sources.

The fundamental purpose of shimming is to make this magnetic field more spatially uniform (regardless of whether the field is explicitly mapped again after such uniformity improvements from shimming.)

Correspondingly, the overall process of shimming can be treated as a process of generating additional shim magnetic fields which locally oppose the variation of intrinsic fields before shimming. Thus, shimming is a process of determining applied current levels, and subsequently applying those currents in shim coils, such that the shim magnetic field counteracts the original field inhomogeneity, at least in part.

For the first iteration, the initial phase map 211 can be used as the residue phase map 213. The term residue is used when referring to the residue phase map 213 because the amount of error in the phase map will gradually decrease for each successive iteration. Phase unwrapping is performed on the residue phase map 213 in step 215. Step 215 can involve estimating new phase values for phase values in the initial phase map 211 that may be off by values of approximately $+/-N*(2\pi)$. With this disclosed method, unwrapping errors can be accommodated as shimming may still be performed effectively.

After unwrapping in step 215, take spatial partial derivatives (e.g. along dx, dy, dz, or as may be denoted as d/dx, d/dy, and d/dz) of the now-unwrapped, residue phase map 213 in step 217 to generate a partially differentiated residue phase map 219. This partially differentiated residue phase map 219 can be used in step 221 to detect phase wrap discontinuities and generate a discontinuity mask 223. The partially differentiated residue phase map 219 may have spike-shaped patterns near values where the phase exhibits large jumps (e.g. +/-360 degrees). The discontinuity mask 223 can be 0 at values of the partially differentiated residue phase map 219 above a predetermined threshold, and 1 otherwise. An example of a predetermined threshold that can be used is $\pi/4_r$, though other thresholds can be used in other embodiments.

Generating partial derivatives does not require that the coordinate system is along the coordinates x, y, and z, or along the preferred coordinates of the gradients hardware, or a along the preferred gradients of shim coils. For example, the coordinate system might be a cylindrical set of coordinates, or a spherical set of coordinates.

Herein, the so-named partially differentiated residue phase map 211 does not specifically imply only one direction of derivatives. Rather, if the phase map 211 is three-dimensional, the partially differentiated residue phase map 219 may be a collection of the all three derivatives d/dx, d/dy, and d/dz. If for example the phase map is only a two-dimensional slice which extends in the x and y directions, then the partially differentiated residue phase map 219 may be a collection of only the derivatives d/dx and d/dy.

In step 236, spatial derivatives (e.g. d/dx, d/dy, d/dz) can be taken of shim functions 235 to generate differentiated shim functions 237. The shim functions 235 can define the magnetic fields producible by the shim coils in the MM apparatus 1. The shim functions can include polynomials, but are not limited to being polynomials. For example, they can include 3D maps defining the magnetic field generated by a non-standard coil. These may correspond to the mathematical functions of regular solid spherical harmonics. Each of the functions can have a corresponding coefficient, which acts like a dial representing how much of that function to apply in order to generate a specific magnetic field in the MRI apparatus 1.

Step 225 is generating radial weights 227. For the first iteration, the radial weights 227 can emphasize a region of high certainty, and deemphasize the remaining regions. For example, the first iteration can emphasize the inner (e.g., center) region if the shim coils are volume coils, Which resemble solid spherical harmonics. As another example, if the shim coils are local coils, which typically form a patchwork or tiling around a volume of interest, the first iteration can emphasize outer, local regions near the local coils.

Step 229 is selecting a regularization factor (i.e., lambda 231) for performing regularization (e.g. Tikhonov regularization) and preventing overfitting in step 233, discussed later. The regularization can be strongest for the first iteration, and get weaker with successive iterations.

Step 233 is fitting to determine coefficients for the shim functions 235. The fitting process will use the partially differentiated residue phase map 219, differentiated shim functions 237, lambda 231, radial weights 227, signal intensity mask 207, and discontinuity mask 223. The fitting can use techniques such as least squares or Moore Penrose pseudoinverse. The end result of step 233 is a set of coefficients of shim terms corresponding to each shim function in the shim functions 235. In an embodiment, the signal intensity mask 207 and/or discontinuity mask 223 do not have to be generated and used in step 233.

As an example, for performing step 233, a combined weighting function, that is a function of the radial weights 227, signal intensity mask 207, and discontinuity mask 223, can be multiplied with the partially differentiated residue phase map 219. The product is then used in a weighted least squares or Moore Penrose analysis along with the differentiated shim functions 237 and lambda 231 for fitting. Furthermore, a penalty can be applied for terms which exceed the physical capabilities of the hardware, according to one embodiment.

One way to generate such a penalty is to perform a modification to a basic Tikhonohov regularization formula. Assuming that the functions used in the fitting, i.e., the partial derivatives of shim field coils, are arranged in a matrix A. Then a typical least-squares solution without regularization involves a term which is the inverse of the matrix product of A-transpose times A. To perform a Tikhonov-regularized least squares, one uses (A-transpose times A) plus lambda times I, where I is the identity matrix, i.e., I is a diagonal matrix of ones. Each term along the diagonal effectively de-weights a particular fitting function, i.e., a function associated with a particular shim coil field. Thus, this corresponds to adding a value of lambda onto the main-diagonal elements of the correlation matrix (A-transpose times A). To further penalize any particular shim term, it is possible to simply add a larger term than lambda onto the main diagonal element of (A-transpose times A). On successive iterations, if for example a certain shim channel the total coefficient or total current exceeds practical hardware limits, then it is suitable to simply increase the penalty term for the main-diagonal entry associated with that shim channel. Since the process is iterative, it is not essential to determine exactly the right amount or penalty in any given step. Rather it can be sufficient to add amounts incrementally, iteration by iteration, until the over-current condition no longer results.

Step 239 is stripping off from the residue phase map 213 to generate an updated phase map 241. The stripping off involves subtracting (1) the coefficients obtained from step 233 multiplied by their respective shim functions 235, from (2) the residue phase map 213. Step 239 can also include stripping off a separately estimated direct current (DC) value from the residue phase map 213 to generate the updated phase map 241.

Estimating and stripping off the zero-order term (the DC term) is done using the initial phase map or the residue phase map, not the partially differentiated map. For example, one can compute the sum of all of the shim channel maps other than the zero-order map, each multiplied by the fitting coefficient. This gives a total shim, except for the zero-order. This shim can then be subtracted from the initial coil map. The remainder is a form of a residue map. The residue map can then be averaged, pixel by pixel, subject to applying the signal intensity mask 207. The values of that residue are then added together for only the pixels at which the mask is one and divided by the number of pixels for which the mask is one. The result is the zero-order term of the overall fit for that particular iteration.

After completing the first iteration, step 243 is determining whether or not to terminate the iteration loop. The decision to terminate can occur if a predetermined stopping criterion is met. If the answer to step 243 is yes, step 251 is to calculate shim currents and hardware settings, which can be applied to the MRI apparatus 1 thereafter, before ending in step 253. Examples of predetermined stopping criteria include, but are not limited to: when values of the radial weights 227 are all equal to 1; when the regularization value lambda has been reduced to zero; after a certain number of iterations have been performed; and after the updated phase map 241 is approximately identical to the residue phase map 213. Alternately, the overall stopping criteria may be that a particular two or more of the previously named criteria are simultaneously satisfied.

If the answer to step 243 is no, step 245 is to replace the residue phase map 213 with the updated phase map 241, and another iteration is performed. As each iteration is performed, slight tweaks can be made. The result is that for each iteration, the residue phase map 213 will likely become smaller, flatter, and have less energy.

Generating radial weights 227 in step 225 can gradually focus on regions of lower confidence for each successive iteration. By the time the last iteration is performed, the radial weights 227 can be approximately uniform at 1. For example, if the shims are volume coils, and the first iteration focused on a inner region, each successive iteration can gradually build towards focusing on outer regions. Lower orders converge first, and the weights can gradually increase outwards until flat. If the shims are local coils and the first iteration focused on an outer region, each successive iteration can gradually build towards focusing on the inner regions.

FIG. 2B illustrates examples of radial weights 227 that can be used, where the x-axis represents a location along an axis, and the y-axis represents a weighting value between 0 and 1.

In an embodiment, if the shim coils are volume coils, the first iteration can use radial weights that resemble plot 255, where there is more weight towards the center and less weight towards both ends. An intermediate iteration can have radial weights that resemble plot 257, where additional weight is applied to regions beyond the center. The final iteration can use radial weights that resemble plot 259, where a uniform weight of 1 is applied.

In an embodiment, if the shim coils are local coils, the first iteration can use radial weights that resemble plot 261, where more weight is put towards the ends compared to the center. An intermediate iteration can have radial weights that resemble plot 263, where additional weight is applied to regions between the ends and the center. The final iteration can use radial weights that resemble plot 265, where a uniform weight of 1 is applied.

The radial weights as depicted in FIG. 2B show weighting along a single spatial direction, like a one-dimensional profile. This is purely a stylized representation. Of course, the actual complete radial weighting functions are three-dimensional, in the case that the overall maps are three-dimensional; or the actual complete radial weighting functions are two-dimensional, in the case that the overall maps are two-dimensional.

In the case where the shim coils involve small local coils near the surface of the patient's anatomy, the optimal setting for each small local coil is determined predominantly by the peripheral areas of the initial phase map, close to each of the local coils. In contrast, the central area of the patient may be affected similarly by each of the many shim coils. Thus, fitting near the center is inherent ill-conditioned and may be numerically unstable. By setting local shim coils with preference with early iterations, stable values seed the calculation for later iterations. The later iterations will have less total energy to fit, and will have less variance in the fits, despite the fact that the fitting with the center is somewhat underdetermined. This is the motivation for the outside-first radial weighting. Intuitively, this corresponds to setting the areas unique high-quality answers can be obtained first, reducing the overall energy in later iterations of the fit, and finally adapting the fit to take more account of the areas of intrinsic uncertainty.

By contrast, in the case where the hardware shim coils are global functions, such as low-ordered polynomials or solid spherical harmonics, the area for which the fit is most uniquely determined is actually near the magnet isocenter. Exactly at the isocenter (where x=0, y=0, z=0), only the zero-order shim has non-zero-effect. Thus, fitting near that area is intrinsically a stable operation. Then, progressively reaching radially outward utilizes increasing amounts of first-order shims, and then second-order shims, and so on. Again, this amounts to starting with the most reliable area first, reducing the amount of residual energy yet to be fit, and finally fully taking into account the areas which are less uniquely determined or less numerically stable.

As previously mentioned, selecting lambda 231 in step 229 can get weaker with each successive iteration on at least some shim coils. Higher order shims usually have a smaller effect on the magnetic field. In an embodiment, step 229 can be dependent on, at least partially, an available hardware range of various shim coefficients. Distinct lambda 231 values can be used for distinct shim coefficients. For example, since the most reduction of inhomogeneity usually comes from lower ordered shim functions, lambda can be 0 for DC and zero order, 0.5 for first order shims, and 1 for second order shims.

Fitting in step 233 can using techniques such as least squares and Moore Penrose for each iteration, while the last iteration can use a constrained fit, such as the Karush Kuhn Tucker method. Thus, numerical solutions for the shim currents which would exceed hardware performance limits are prevented.

Figure 3:
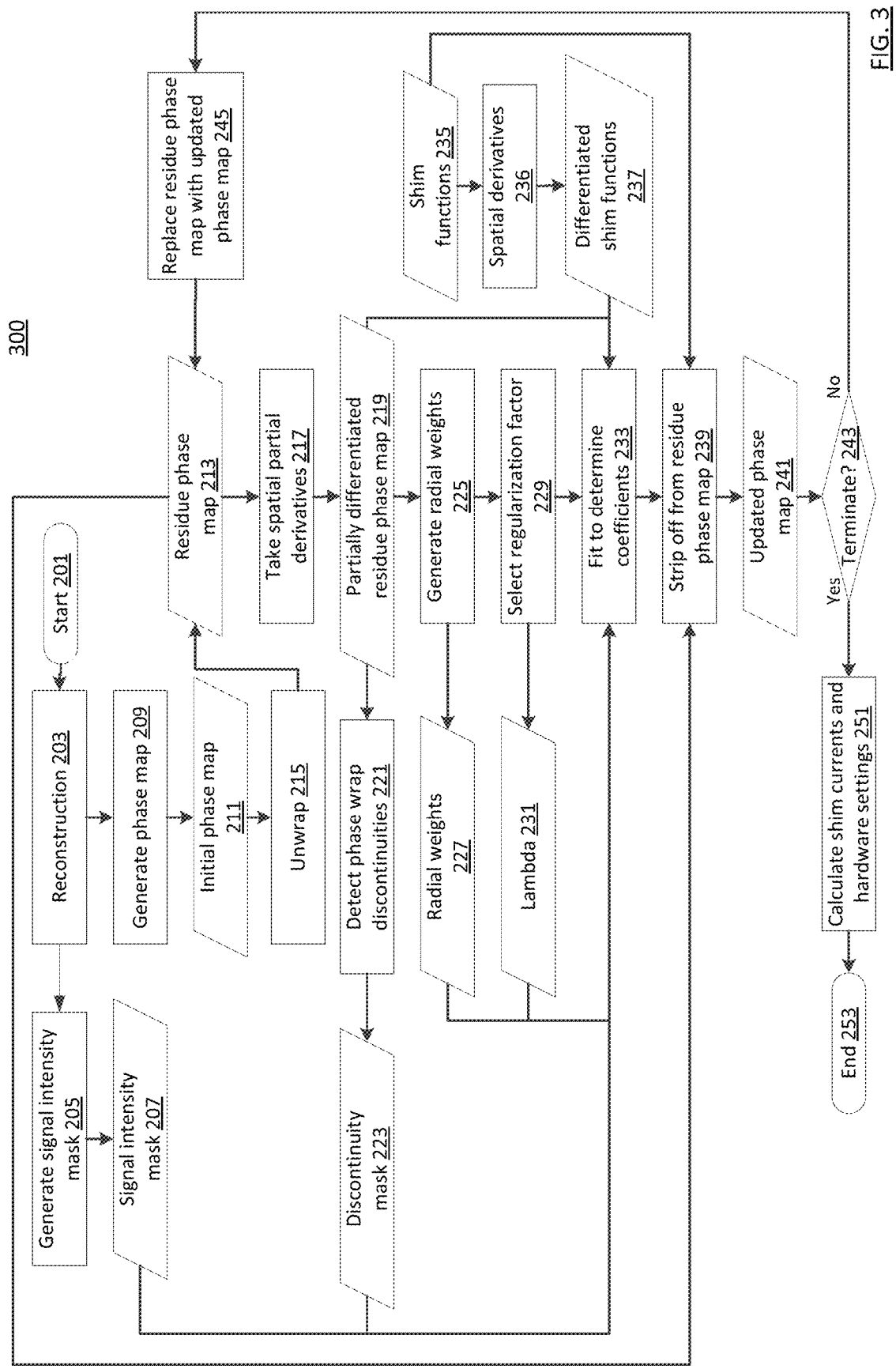
FIG. 3 shows a method for performing shimming, according to an exemplary embodiment of the present disclosure.

In method 200, phase unwrapping in step 215 was performed for each iteration. In another embodiment, as shown in FIG. 3, step 215 can instead be performed just once before the iteration loop begins. In method 300 shown in FIG. 3, step 215 is performed on the initial phase map 211 to generate the residue phase map 213. Thereafter, the method 300 goes through the same steps as in method 200, but the phase unwrapping of step 215 is omitted from the iterative part of the process.

Figure 4:
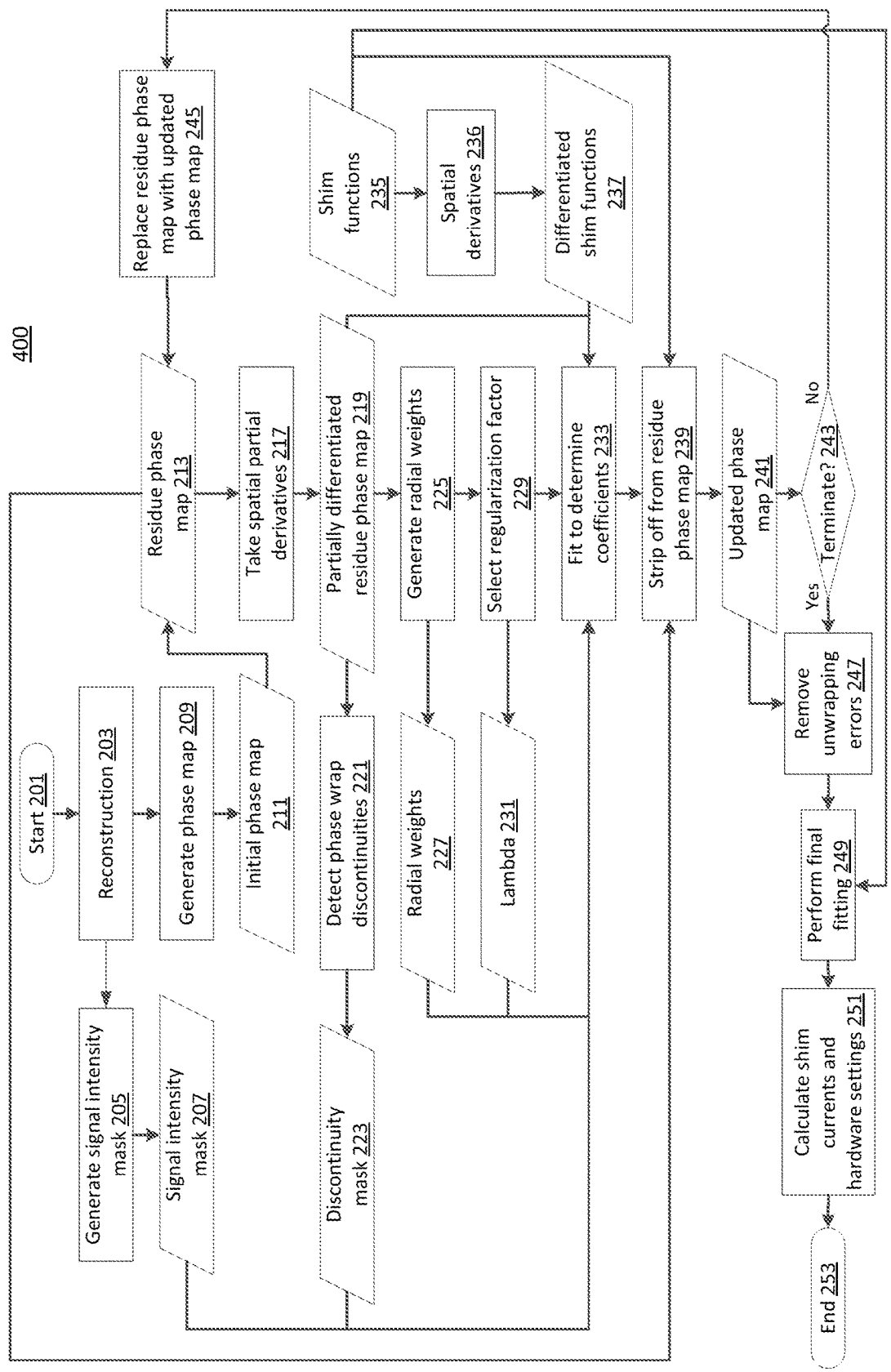
FIG. 4 shows a method for performing shimming, according to an exemplary embodiment of the present disclosure.

In another embodiment, as shown in FIG. 4, step 215 can be removed. In other words, phase unwrapping does not have to be performed.

Furthermore, still referring to FIG. 4, after terminating in step 243, unwrapping errors can be removed from the updated phase map 241 in step 247. Step 247 can involve identifying regions of phase unwrapping error (e.g. where phase difference is approximately $+/-N*(2\pi)$, and removing these identified regions. A final fitting can be performed in step 249 using the output of step 247 and the shim functions 235, before calculating shim currents and hardware settings in step 251. The hardware settings can be important to consider because the amount of current applied to hardware can have an effect the magnetic field even though they are independent from the shim coils.

Although not expressly shown in FIG. 2A, when fitting is done in successive iterations, and each iteration involves stripping off the incremental fit from that iteration, then the total value of the shim coil coefficients or the shim coil currents may be the summation of the incremental fits from each iteration up to that point.

Method 400 is essentially performing two main steps: (1) improving phase unwrapping using derivatives, iteration, and stabilization, and (2) final fitting without spatial derivatives. Note that step 1 is a purely mathematic step, and need not be constrained to what is physically feasible on an MRI scanner's hardware. Thus, it is possible to do the calculation for the phase unwrapping with at least some hypothetical shim functions. For example, a given scanner may have shim hardware for the functions of second-order spatial terms, but not third order terms. For anatomies like the head and neck, it may be the case that z-cubed, which is a third-order function, is very effective at removing residual error. Therefore, a z-cubed shimming field function may be used for improved phase unwrapping, but on the final fitting in step 249, z-cubed is not utilized since it is not physically present.

In an embodiment, the techniques discussed herein can be applied with acquisition of one or more 2D slices and for which two directions of spatial derivatives are used, according to the geometry of the acquisition. In an embodiment, the techniques discussed herein can be applied with acquisition of 3D volumes, and with use of three directions of spatial derivatives.

As can be appreciated by one of skill in the art, the order of steps discussed with respect to methods 200, 300, 400 can vary in other embodiments. In particular, the order of steps performed to obtain the various inputs used for performing the fitting in step 233 (i.e. i.e., signal intensity mask 207, discontinuity mask 223, radial weights 227, lambda 231, differentiated shim functions 237, partially differential residue phase map 219) can be performed in any order.

FIGS. 5A-5D illustrate results of a numerical simulation. The simulation shows that good fitting and shimming can be accomplished even when unwrapping errors persist. Further, the critical robustness of the fitting step to unwrapping errors is demonstrated.

Figure 5A:
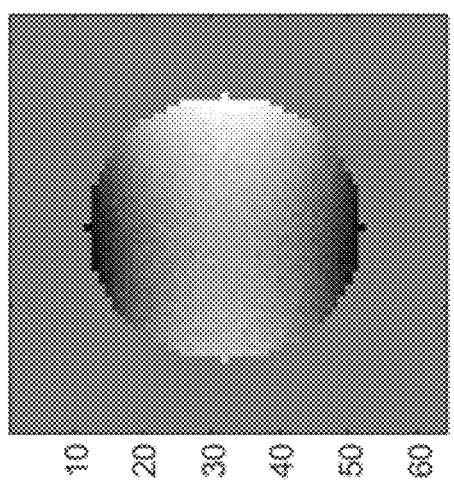
FIG. 5A shows a numerical phantom, according to an exemplary embodiment of the present disclosure.
Figure 5C:
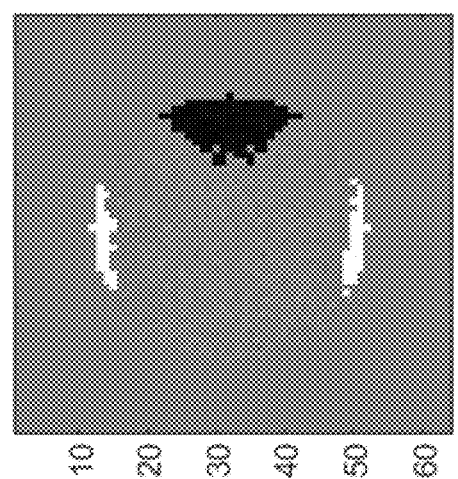
FIG. 5C shows the numerical phantom after two iterations, according to an exemplary embodiment of the present disclosure.
Figure 5B:
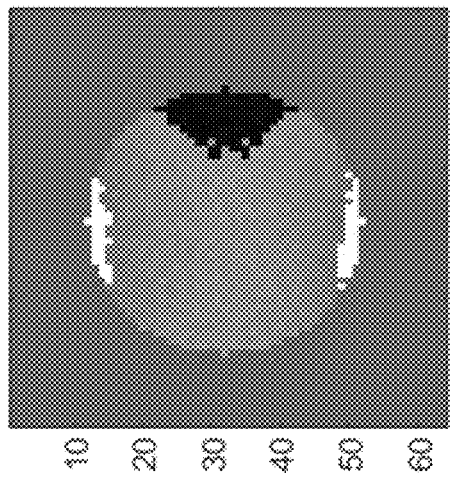
FIG. 5B shows the numerical phantom after one iteration, according to an exemplary embodiment of the present disclosure.
Figure 5D:
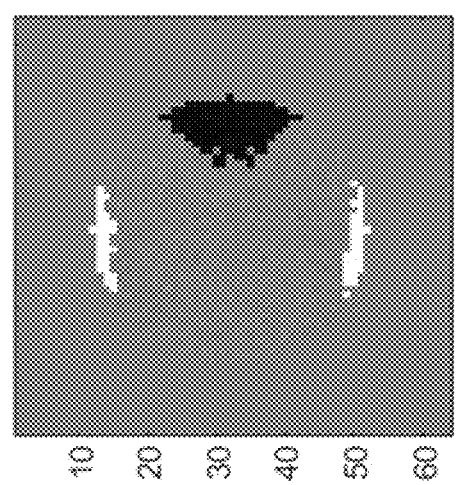
FIG. 5D shows the numerical phantom after seven iterations, according to an exemplary embodiment of the present disclosure.

FIG. 5A shows a numerical phantom spanning a range of about 5 parts per million (ppm) peak-to-peak, and having no unwrapping error. However, this input gets used with a phase wrapping error of phases outside a range of approximately 3.5 ppm (i.e., higher than approximately +1.75 ppm or lower than approximately −1.75 ppm). FIGS. 5B, 5C, and 5D represent iterations 1, 2, and 7, respectively, and demonstrates good convergence of shimming, in the extreme test cases for when the phase unwrapping step is completely bypassed. Residue in the object becomes closer to the zero value outside the digital object. The fit is excellent, in that the only significant deviation is from the phase unwrapping error, which is a mathematical artifact, and not a feature of the fundamental numerical phantom 5A.

The method and system described herein can be implemented in a number of technologies but generally relate to imaging devices and processing circuitry for performing the processes described herein. In one embodiment, the processing circuitry (e.g., image processing circuitry and controller circuitry) is implemented as one of or as a combination of: an application specific integrated circuit (ASIC), a field programmable gate array (FPGA), a generic array of logic (GAL), a programmable array of logic (PAL), circuitry for allowing one-time programmability of logic gates (e.g., using fuses) or reprogrammable logic gates. Furthermore, the processing circuitry can include a computer processor and having embedded and/or external non-volatile computer readable memory (e.g., RAM, SRAM, FRAM, PROM, EPROM, and/or EEPROM) that stores computer instructions (binary executable instructions and/or interpreted computer instructions) for controlling the computer processor to perform the processes described herein. The computer processor circuitry may implement a single processor or multiprocessors, each supporting a single thread or multiple threads and each having a single core or multiple cores.

Obviously, numerous modifications and variations are possible in light of the above teachings. It is therefore to be understood that within the scope of the appended claims, embodiments of the present disclosure may be practiced otherwise than as specifically described herein.

Embodiments of the present disclosure may also be as set forth in the following parentheticals.

(1) A method of improving magnetic field uniformity comprising: step (1): taking a spatial partial derivative of a residue phase map to generate a partially differentiated residue phase map; step (2): taking a spatial derivative of one or more shim functions, the shim functions approximating magnetic fields producible by respective shim coils, to generate one or more differentiated shim functions; step (3): generating radial weights; step (4): selecting a regularization factor; step (5): generating one or more masks; step (6): determining coefficients for each of the shim functions via fitting, wherein the fitting is based on at least one of the partially differentiated residue phase map, the one or more differentiated shim functions, the radial weights, the regularization factor, and the one or more masks; step (7): updating the residue phase map based on the coefficients and the one or more shim functions to generate an updated phase map; and step (8): iteratively repeating steps (1)-(7) using the updated phase map as the residue phase map for each successive iteration until a predetermined stopping criteria is met, wherein, for each successive iteration, steps (1)-(5) are performed in any order, step (6) is performed after steps (1)-(5), and step (7) is performed after step (6).

(2) The method of (1), further comprising performing phase unwrapping on an initial phase map to generate the residue phase map, wherein the phase unwrapping is performed once before step (8) and not again thereafter.

(3) The method of any (1) to (2), further comprising performing phase unwrapping on the residue phase map, before step (1), for each successive iteration.

(4) The method of any (1) to (3), wherein the radial weights initially emphasize an inner region of an area, and gradually emphasize outer regions of the area for each successive iteration.

(5) The method of any (1) to (3), wherein the radial weights initially emphasize a first region of an area, and gradually emphasize, for each successive iteration, regions between the first region and a second region of the area opposite the first region, wherein (a) the first region is an inner region and a second region is an outer region or (b) the first region is an outer region and the second region is an inner region.

(6) The method of any (1) to (5), further comprising calculating, after completing step (8), at least one of hardware settings and shim currents for the shim coils using the updated residue phase map.

(7) The method of any (1) to (6), further comprising removing, after completing step (8), unwrapping errors from the updated residue phase map; and performing a final fitting using the shim functions and the updated residue phase map after the removing.

(8) The method of any (1) to (7), wherein the regularization factor gets weaker for each successive iteration.

(9) The method of any (1) to (8), wherein in a case that a last iteration in the iteratively repeating is reached, a constrained fit is performed.

(10) The method of any (1) to (9), wherein the updating the residue phase map to generate the updated phase map in step (7) is further based on an estimated DC value.

(11) A system for improving magnetic field uniformity comprising: processing circuitry configured to function (1): take a spatial partial derivative of a residue phase map to generate a partially differentiated residue phase map; function (2): take a spatial derivative of one or more shim functions, the shim functions approximating magnetic fields producible by respective shim coils, to generate one or more differentiated shim functions; function (3): generate radial weights; function (4): select a regularization factor; function (5): generate one or more masks; function (6): determine coefficients for each of the shim functions via fitting, wherein the fitting is based on at least one of the partially differentiated residue phase map, the one or more differentiated shim functions, the radial weights, the regularization factor, and the one or more masks; function (7): update the residue phase map based on the coefficients and the one or more shim functions to generate an updated phase map; and function (8): iteratively repeat functions (1)-(7) using the updated phase map as the residue phase map for each successive iteration until a predetermined stopping criteria is met, wherein, for each successive iteration, functions (1)-(5) are performed in any order, function (6) is performed after functions (1)-(5), and function (7) is performed after function (6).

(12) The system of (11), wherein the processing circuitry is further configured to perform phase unwrapping on an initial phase map to generate the residue phase map, the phase unwrapping performed once before function (8) and not again thereafter.

(13) The system of any (11) to (12), wherein the processing circuitry is further configured to perform phase unwrapping on the residue phase map, before function (1), for each successive iteration.

(14) The system of any (11) to (13), wherein the radial weights initially emphasize an inner region of an area, and gradually emphasize outer regions of the area for each successive iteration.

(15) The system of any (11) to (13), wherein the radial weights initially emphasize a first region of an area, and gradually emphasize, for each successive iteration, regions between the first region and a second region of the area opposite the first region, wherein (a) the first region is an inner region and a second region is an outer region or (b) the first region is an outer region and the second region is an inner region.

(16) The system of any (11) to (15), wherein the processing circuitry is further configured to calculate, after completing function (8), at least one of hardware settings and shim currents for the shim coils using the updated residue phase map.

(17) The system of any (11) to (16), wherein the processing circuitry is further configured to remove, after completing function (8), unwrapping errors from the updated residue phase map; and perform a final fitting using the shim functions and the updated residue phase map after removing the unwrapping errors from the updated residue phase map.

(18) The system of any (11) to (17), wherein the regularization factor gets weaker for each successive iteration.

(19) The system of any (11) to (18), wherein in a case that a last iteration in the iteratively repeating is reached, a constrained fit is performed.

(20) The system of any (11) to (19), wherein updating the residue phase map to generate the updated phase map in function (7) is further based on an estimated DC value.

Thus, the foregoing discussion discloses and describes merely exemplary embodiments of the present disclosure. As will be understood by those skilled in the art, the present disclosure may be embodied in other specific forms without departing from the spirit thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

The invention claimed is:

1. A method of improving magnetic field uniformity, comprising:
   step (1): taking a spatial partial derivative of a residue phase map to generate a partially differentiated residue phase map;
   step (2): taking a spatial derivative of one or more shim functions, the one or more shim functions approximating magnetic fields producible by respective shim coils, to generate one or more differentiated shim functions;
   step (3): generating radial weights;
   step (4): selecting a regularization factor;
   step (5): generating one or more masks;
   step (6): determining coefficients for each of the one or more shim functions via fitting, wherein the fitting is based on at least one of the partially differentiated residue phase map, the one or more differentiated shim functions, the radial weights, the regularization factor, and the one or more masks;

step (7): updating the residue phase map based on the coefficients and the one or more shim functions to generate an updated phase map;

step (8): iteratively repeating steps (1)-(7) using the updated phase map as the residue phase map for each successive iteration until a predetermined stopping criterion is met, wherein, for each successive iteration, steps (1)-(5) are performed in any order, step (6) is performed after steps (1)-(5), and step (7) is performed after step (6); and performing a magnetic resonance imaging sequence using shim currents for the shim coils, the shim currents being calculated from the updated residue phase map.

2. The method of claim 1, further comprising performing phase unwrapping on an initial phase map to generate the residue phase map, wherein the phase unwrapping is performed before step (8) and not again thereafter.

3. The method of claim 1, further comprising performing phase unwrapping on the residue phase map, before step (1), for each successive iteration.

4. The method of claim 1, wherein the radial weights initially emphasize an inner region of an area, and gradually emphasize outer regions of the area for each successive iteration.

5. The method of claim 1, wherein the radial weights initially emphasize an outer region of an area, and gradually emphasize inner regions of the area for each successive iteration.

6. The method of claim 1, further comprising calculating, after completing step (8), hardware settings and the shim currents for the shim coils using the updated residue phase map.

7. The method of claim 1, further comprising removing, after completing step (8), unwrapping errors from the updated residue phase map; and performing a final fitting using the one or more shim functions and the updated residue phase map after the removing.

8. The method of claim 7, further comprising taking spatial derivatives of a mathematical shim function not corresponding to physically embodied shim coils.

9. The method of claim 1, wherein the regularization factor gets weaker for each successive iteration.

10. The method of claim 1, wherein in a case that a last iteration in the iteratively repeating is reached, a constrained fit is performed.

11. The method of claim 1, wherein the updating the residue phase map to generate the updated phase map in step (7) is further based on an estimated DC value.

12. A system for improving magnetic field uniformity, comprising:

processing circuitry configured to function (1): take a spatial partial derivative of a residue phase map to generate a partially differentiated residue phase map;

function (2): take a spatial derivative of one or more shim functions, the one or more shim functions approximating magnetic fields producible by respective shim coils, to generate one or more differentiated shim functions;

function (3): generate radial weights;

function (4): select a regularization factor;

function (5): generate one or more masks;

function (6): determine coefficients for each of the one or more shim functions via fitting, wherein the fitting is based on at least one of the partially differentiated residue phase map, the one or more differentiated shim functions, the radial weights, the regularization factor, and the one or more masks;

function (7): update the residue phase map based on the coefficients and the one or more shim functions to generate an updated phase map;

function (8): iteratively repeat functions (1)-(7) using the updated phase map as the residue phase map for each successive iteration until a predetermined stopping criterion is met, wherein, for each successive iteration, functions (1)-(5) are performed in any order, function (6) is performed after functions (1)-(5), and function (7) is performed after function (6); and perform a magnetic resonance imaging sequence using shim currents for the shim coils, the shim currents being calculated from the updated residue phase map.

13. The system of claim 12, wherein the processing circuitry is further configured to perform phase unwrapping on an initial phase map to generate the residue phase map, the phase unwrapping performed once before function (8) and not again thereafter.

14. The system of claim 12, wherein the processing circuitry is further configured to perform phase unwrapping on the residue phase map, before function (1), for each successive iteration.

15. The system of claim 12, wherein the radial weights initially emphasize a first region of an area, and gradually emphasize, for each successive iteration, regions between the first region and a second region of the area opposite the first region, wherein (a) the first region is an inner region and a second region is an outer region or (b) the first region is an outer region and the second region is an inner region.

16. The system of claim 12, wherein the processing circuitry is further configured to calculate, after completing function (8), hardware settings and the shim currents for the shim coils using the updated residue phase map.

17. The system of claim 12, wherein the processing circuitry is further configured to remove, after completing function (8), unwrapping errors from the updated residue phase map; and perform a final fitting using the one or more shim functions and the updated residue phase map after removing the unwrapping errors from the updated residue phase map.

18. The system of claim 12, wherein the regularization factor gets weaker for each successive iteration.

19. The system of claim 12, wherein, when a last iteration in the iteratively repeating is reached, a constrained fit is performed.

20. The system of claim 12, wherein updating the residue phase map to generate the updated phase map in function (7) is further based on an estimated DC value.

* * * * *